US006949981B2

(12) United States Patent
Natonio et al.

(10) Patent No.: US 6,949,981 B2
(45) Date of Patent: Sep. 27, 2005

(54) DYNAMIC THRESHOLD FOR VCO CALIBRATION

(75) Inventors: Joseph Natonio, Wappingers Falls, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/708,233

(22) Filed: Feb. 18, 2004

(65) Prior Publication Data

US 2005/0179501 A1 Aug. 18, 2005

(51) Int. Cl.[7] .................................................. H03L 7/00
(52) U.S. Cl. ......................................... 331/17; 331/179
(58) Field of Search ............................ 331/1 A, 11, 16, 331/17, 34, 179

(56) References Cited

U.S. PATENT DOCUMENTS

| | | | | |
|---|---|---|---|---|
| 5,382,922 A | 1/1995 | Gersbach et al. | ........... | 331/1 A |
| 6,175,282 B1 | 1/2001 | Yasuda | ........................ | 331/44 |
| 6,275,115 B1 * | 8/2001 | Egawa | ........................ | 331/11 |
| 6,483,387 B1 * | 11/2002 | Fernandez-Texon | ......... | 331/17 |
| 6,747,519 B2 * | 6/2004 | Jaehne et al. | ................. | 331/16 |
| 6,778,024 B2 * | 8/2004 | Gupta et al. | .................. | 331/16 |

* cited by examiner

*Primary Examiner*—Tuan T. Lam
(74) *Attorney, Agent, or Firm*—Ohlandt, Greeley, Ruggiero & Perle, L.L.P.; Joseph P. Abate

(57) ABSTRACT

A voltage controlled oscillator (VCO) is provided which includes a threshold level setting circuit operable to set a lower variable threshold level and to set an upper variable threshold level. The VCO includes a frequency band selection unit operable to adjust a frequency band setting of the VCO to one of a plurality of frequency band settings. The VCO further includes a comparator operable to determine whether a control voltage of the VCO falls between the lower threshold level and the upper threshold level. The VCO further includes a threshold adjustment and calibration circuit operable to maintain the frequency band setting when the control voltage falls between the lower and upper threshold levels. Otherwise, when the control voltage lies below the lower threshold level, the lower threshold level is adjusted downward and the upper threshold level is adjusted upward, and when the control voltage lies above the upper threshold level, the frequency band selection is increased to a next higher frequency band.

20 Claims, 5 Drawing Sheets

DYNAMIC THRESHOLD FOR VCO CALIBRATION

BACKGROUND OF INVENTION

The present invention relates to voltage controlled oscillators (VCOs), especially VCOs and methods of setting VCOs to achieve a desirable locking condition.

Voltage controlled oscillators (VCOs) are typically used in phase locked loops to provide a stable oscillator output which can be varied in frequency across large frequency ranges. For example, VCOs are utilized in receivers to provide a variable oscillator frequency for shifting down the frequency of an input signal having a variable center frequency. VCOs are also utilized in some transmitters to provide a variable oscillator frequency with which to shift up the frequency of a signal to a selected one of plurality of center frequencies.

FIG. 1 is a diagram illustrating a voltage controlled oscillator 10 as arranged in a basic phase locked loop (PLL) 12 according to the prior art. In the PLL shown in FIG. 1, the output frequency $f_o$ of the VCO is set by a frequency select input FSEL to a divide by N circuit 14 which functions to divide the output frequency $f_o$ down to a reference frequency generated by a reference oscillator 16. The output of the divide by N circuit 14 and the reference oscillator 16 are both input to a phase comparator 18, which outputs a signal representing frequency/phase difference between the two inputs. The difference signal 19 is provided to a loop filter 20, which, in turn, outputs a control voltage 22 that controls the output frequency $f_o$ of the VCO 10. In such prior art PLL, the VCO output frequency $f_o$ is a multiple N of the output frequency of the reference oscillator. A calibration logic circuit 24 receives the VCO control voltage 22 and further controls operations of the VCO which result in locking the VCO 10.

In addition to controlling the VCO through the control voltage input 22, many VCOs today provide additional granularity of control by separating the frequency range over which the VCO operates into a plurality of frequency bands. Then, the frequency band selection is changed as the VCO moves toward the locked condition. For example, the frequency band of the prior art PLL 12 is changed by a signal 26 output from the calibration logic circuit 24 when the control voltage 22 reaches a maximum value, and the VCO has not yet achieved lock. Such signal 26 is generally referred to as a "coarse calibration" signal. Sometimes, the coarse calibration signal is generated in response to the signal 19 output from the phase comparator 18 to the loop filter 20.

An example of operation of the prior art VCO 10 will now be described. To change the VCO output frequency of the prior art VCO, the frequency select (FSEL) input to the PLL 12 is changed. With reference to FIG. 2, at that time the calibration logic 24 selects the lowest frequency band B1 of the VCO 10 to begin adjusting the VCO settings towards the desired output frequency $f_o$. In FIG. 2, the VCO output frequency $f_o$ increases with the vertical scale while the VCO control voltage 22 increases with the horizontal scale. The VCO control voltage is scanned from a lowest (negative voltage) setting 28 through the zero volts setting up to a highest (positive voltage) setting 30 while the calibration logic circuit 24 determines whether lock is achieved. As the highest frequency 32 reached by frequency band B1 is still lower than the desired output frequency $f_o$, a coarse calibration signal 26 is output from the calibration logic circuit 24, which signal increments the frequency band to frequency band B2. The VCO control voltage is then adjusted again beginning from the lowest setting and increasing towards the highest setting to seek an operating point at which the desired output frequency $f_o$ is achieved.

This procedure is performed for each successive frequency band and control voltage value until a value of the VCO control voltage is reached at which the desired output frequency $f_o$ is achieved. However, as shown in FIG. 2, multiple values 32, 34 and 36 of the VCO control voltage exist at which the desired output frequency $f_o$ is achieved, although each setting is associated with a different frequency band setting of the VCO. For example, control voltage setting 32 lies on frequency band 3, while control voltage setting 34 lies on frequency band 4, and control voltage setting 34 lies on frequency band 5. Prior art procedures for determining frequency band and control voltage settings at which to lock the VCO have been problematic. The problems will be described next, with reference to FIGS. 3, 4 and 5.

A first such approach according to the prior art is illustrated in FIG. 3. In such approach, a search for appropriate VCO settings begins from the lowest control voltage setting 40 of the lowest frequency band B1. By operation of the phase locked loop 12, the control voltage is scanned upward within each frequency band, and the frequency band setting is increased one or more times, as needed, until a value 40 of the control voltage is reached which results in the desired output frequency $f_o$. Such control voltage setting and frequency band setting result in the VCO settling at the output frequency $f_o$. However, the calibration logic 24 has not yet determined the final settings to lock the VCO 12.

It is desired that the VCO lock at a control voltage setting that is as close as possible to zero volts. Under such condition, the desired output frequency $f_o$ can be most quickly restored after noise and momentary spikes by the automatic action of the PLL. In the approach illustrated in FIG. 3, the VCO 10 selects an appropriate setting by requiring the control voltage 22 to turn negative before the PLL 12 is determined to have finally locked. As a result, the control voltage 40 is rejected as not an appropriate setting. The frequency band is then incremented to band B4, at which time a control voltage value 41 is reached which again results in the desired output frequency $f_o$. However, the control voltage value 41 is rejected as being a positive value, even though the value 41 actually lies close to zero volts. Therefore, the frequency band is incremented again to a higher frequency band B5. Eventually, the control voltage value 42 is reached which results in the desired output frequency $f_o$ and is a negative value. However, this time the final control voltage value 42 lies farther from zero volts than the control voltage value 41 that was reached in the lower frequency band B4. This illustrates a problem of the prior art approach in failing to reach a control voltage value near zero volts.

FIG. 4 illustrates VCO locking operation according to another prior art approach. In such approach, the VCO is not required to lock only at a negative control voltage value. Instead, fixed positive and negative threshold levels +Vt and Vt are provided, against which the control voltage value is tested to determine whether an appropriate control voltage setting has been reached. Again, the search for appropriate VCO settings begins from the lowest control voltage setting 48 of the lowest frequency band B1. As shown in FIG. 4, a control voltage value 50 is first reached which results in the desired output frequency $f_o$. This value 50 is then tested against the positive and negative threshold levels +Vt and Vt. Since the value 50 lies outside of the range from to +Vt, it is determined to be an unsuitable setting. The frequency band is therefore incremented to a next higher band B4, and eventually a control voltage value 51 is reached which does fall within the range Vt to +Vt. Under such conditions, the calibration logic 24 of the VCO determines lock to have been achieved, and the control voltage and frequency band settings are therefore maintained from that time on.

FIG. 5 illustrates a problem with the approach described above relative to FIG. 4. As shown in FIG. 5, it happens for some output frequencies $f_o$ that there is no control voltage and frequency band setting that falls within the voltage range to +Vt between the fixed threshold levels. As shown in FIG. 5, when the control voltage value 61 is reached which first results in the desired output frequency $f_o$, the calibration logic 24 rejects that control voltage value as unsuitable. The frequency band is then incremented, and an attempt is next made to lock the VCO 12 at the control voltage value 62. However, that value 62 lies below the lower threshold Vt. Therefore, value 62 is also rejected as being an unsuitable control voltage. As a result, the VCO is not permitted to remain at either of the two possible control voltage settings 61 and 62, and fails to lock at any settings.

Accordingly, it would be desirable to provide a VCO which is operable to lock at a control voltage that is desirably close to zero.

It would further be desirable to provide a VCO which is operable to lock at a control voltage falling between a lower threshold and an upper threshold.

It would further be desirable to provide a VCO in which the range between the lower and upper thresholds is widened as needed to allow the VCO to lock at a desirable control voltage value.

SUMMARY OF INVENTION

A voltage controlled oscillator (VCO) is provided which includes a threshold level setting circuit operable to set a lower variable threshold level and to set an upper variable threshold level. The VCO includes a frequency band selection unit operable to adjust a frequency band setting of the VCO to one of a plurality of frequency band settings. The VCO further includes a comparator operable to determine whether a control voltage of the VCO falls between the lower threshold level and the upper threshold level. The VCO further includes a threshold adjustment and calibration circuit operable to maintain the frequency band setting when the control voltage falls between the lower and upper threshold levels. Otherwise, when the control voltage lies below the lower threshold level, the lower threshold level is adjusted downward and the upper threshold level is adjusted upward, and when the control voltage lies above the upper threshold level, the frequency band selection is incremented to a next higher level.

DETAILED DESCRIPTION

According to embodiments of the invention, a method is provided for calibrating a voltage controlled oscillator (VCO) of a phase locked loop (PLL). In such method, control input is provided to change the VCO output frequency and an interval of time is allowed for the VCO to stabilize at control voltage and frequency band settings which result in the desired output frequency $f_o$. A signal representing the VCO control voltage is then compared to a lower threshold Vt and an upper threshold +Vt. When the signal representing the control voltage lies between the lower and upper thresholds, the frequency band selection of the VCO and the control voltage setting are maintained at the current values. This locks the VCO at the desired output frequency $f_o$.

However, if the control voltage setting is determined to be lower than the range Vt to +Vt of voltages between the thresholds, the lower variable threshold level is adjusted downwardly (and the upper threshold level is adjusted upwardly as well). The calibration procedure is then begun again, starting from waiting an interval of time for the control voltage and frequency band settings to stabilize.

On the other hand, when the control voltage lies above the upper threshold level, a higher frequency band is selected. The calibration procedure is then begun again starting from waiting an interval of time for the control voltage and frequency band settings to stabilize. In either case, the calibration procedure is continued until definitive settings of the control voltage and frequency band settings are reached at which the VCO is desirably locked. Finally, the VCO stabilizes at a value of the control voltage which is desirably close to zero volts.

Figure 1:
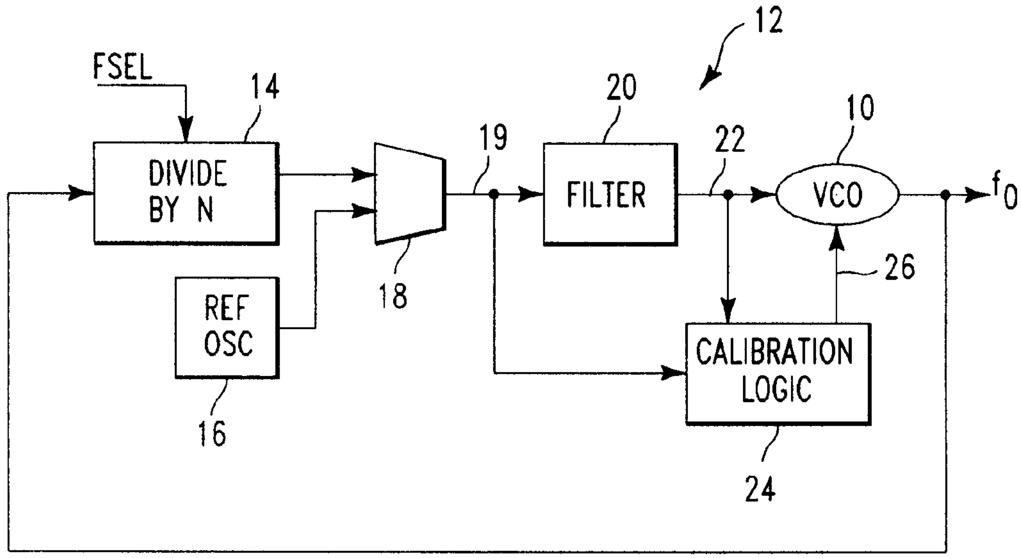
FIG. 1 is block and schematic diagram illustrating a phase locked loop including a voltage controlled oscillator (VCO) according to the prior art.
Figure 2:
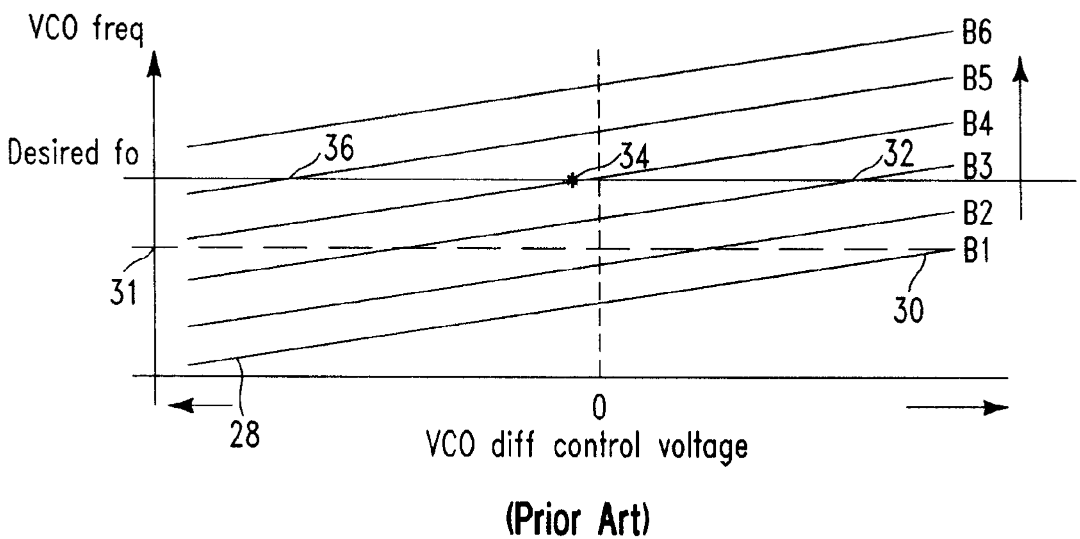
FIGS. 2 through 5 illustrate calibration operations of VCOs according to the prior art.
Figure 3:
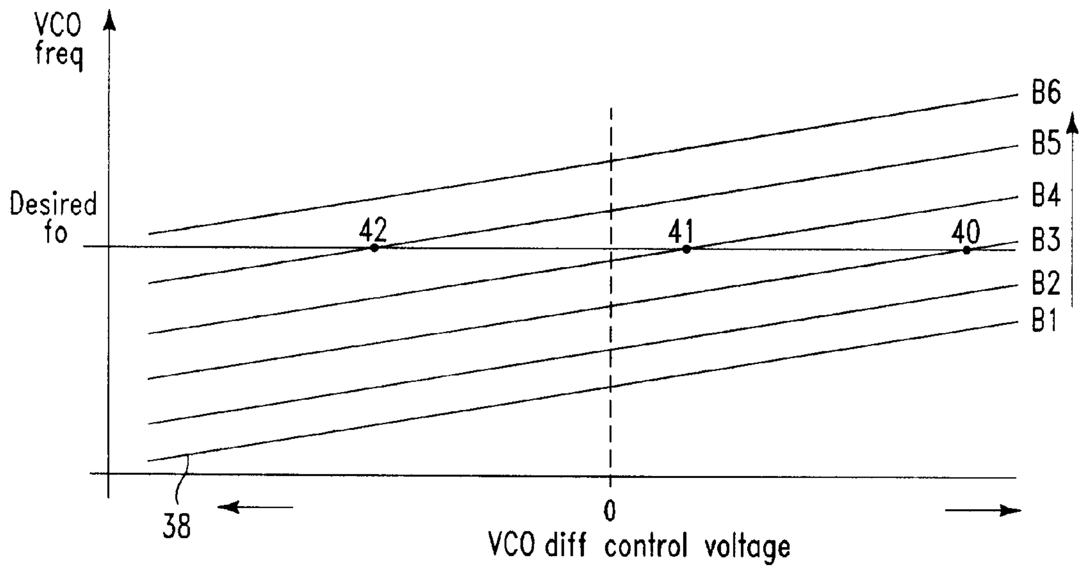
Figure 4:
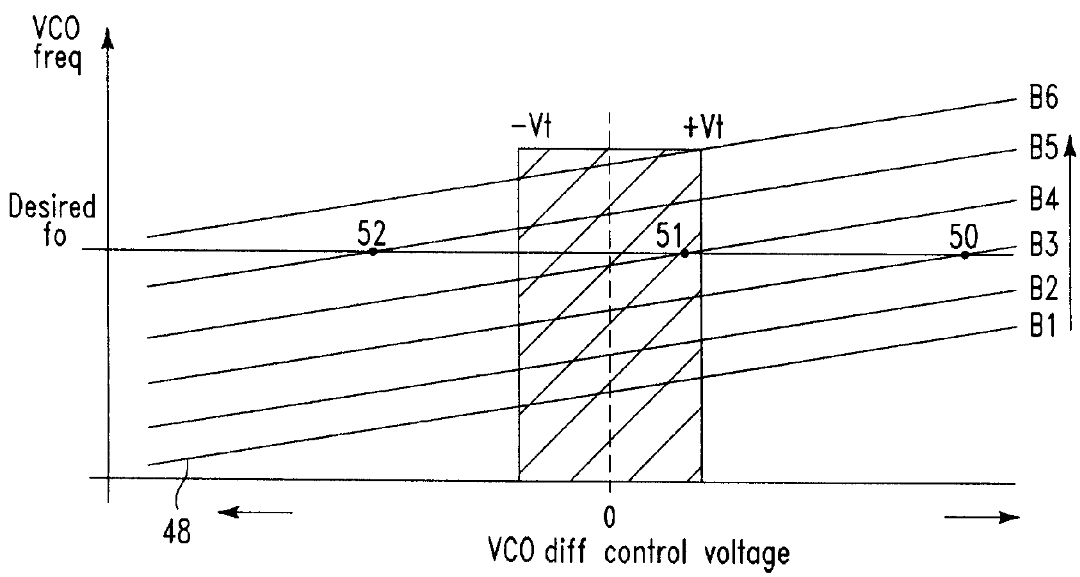
Figure 5:
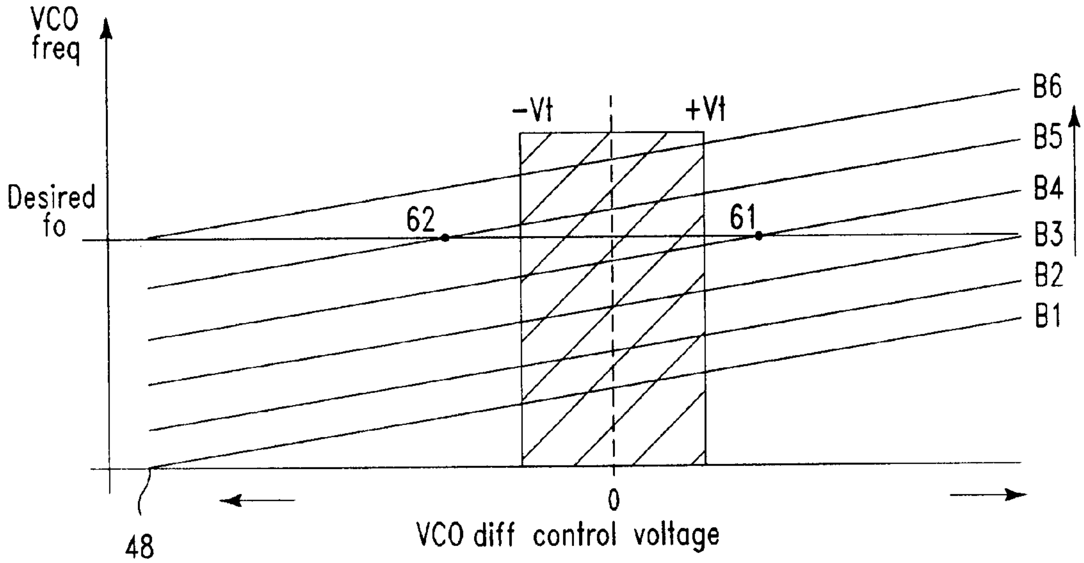
Figure 6:
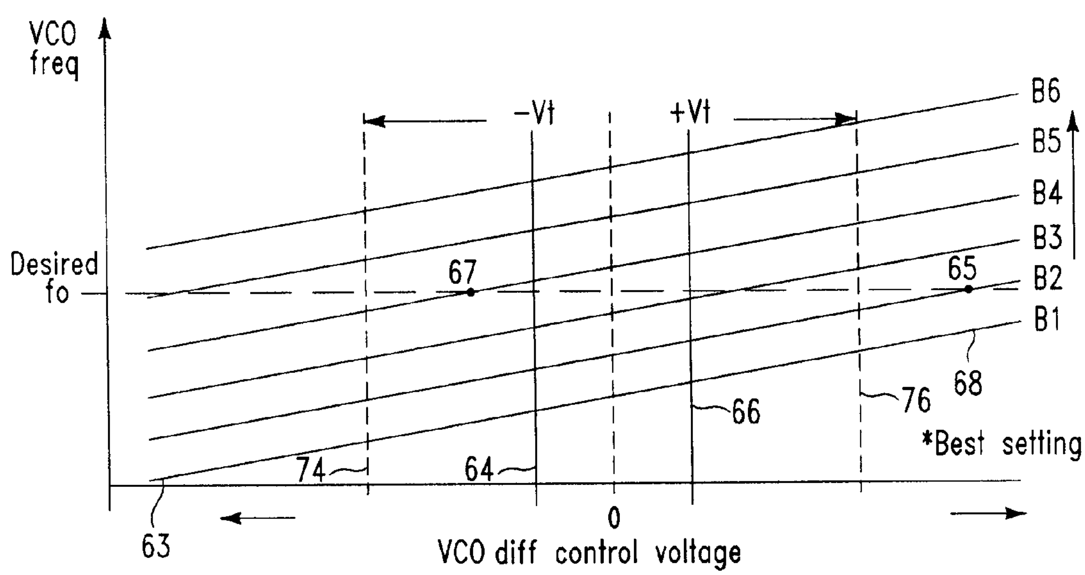
FIG. 6 illustrates a calibration operation of a VCO according to an embodiment of the invention.

FIG. 6 illustrates a principle of operation according to an embodiment of the invention. As illustrated in FIG. 6, the VCO operates over a plurality of frequency bands B1 through B6, in which control voltage is variable from a lowest negative value 63, through zero volts to a highest positive value 68. As in the locking approach described above with respect to FIGS. 4 and 5, the VCO is designed to lock at a control voltage which falls between a lower threshold Vt and an upper threshold +Vt. However, the lower threshold Vt and the upper threshold +Vt are both variable in magnitude. The variable thresholds permit the locking range Vt to +Vt to be widened just to the values 64, 66 sufficiently to permit the VCO to lock at a control voltage value which is closer to zero volts than any other control voltage setting that results in the desired output frequency $f_o$.

As illustrated in FIG. 6, the search for appropriate VCO settings begins from the lowest control voltage setting 63 of the lowest frequency band B1. The lower and upper threshold levels are set to initial settings Vt it 64 and +Vt at 66. As shown in FIG. 6, a control voltage value 65 is first reached within frequency band B2 which results in the desired output frequency $f_o$. This value 65 is tested against the positive and negative threshold levels +Vt and Vt. Since the value 65 lies above the highest threshold voltage +Vt, it is determined to be an unsuitable setting. The frequency band is therefore incremented to the next higher band B3, at which time a control voltage value 67 is reached which results in the desired output frequency $f_o$ but falls below the lower threshold Vt at 64. At this time, however, a change is made to the threshold levels to assure that the control voltage 67 falls within the range of the lower and upper thresholds. Accordingly, the lower threshold Vt is decreased from its original setting to the lower voltage 74 while the upper threshold +Vt is increased from its original setting to the higher voltage 76.

In a preferred embodiment, the range between the lower threshold Vt and the upper threshold +Vt is widened incrementally, just to the point needed to accommodate the control voltage setting at which the desired output frequency $f_o$ has been attained. In such manner, the range is not widened excessively to the point at which multiple VCO settings are encompassed. For example, on a first pass after determining that the control voltage does not fall within the range of threshold levels, the range is incrementally widened in each direction. Then, if the control voltage value still does not fall within the range of threshold levels, the range is incrementally widened again in each direction.

Figure 7:
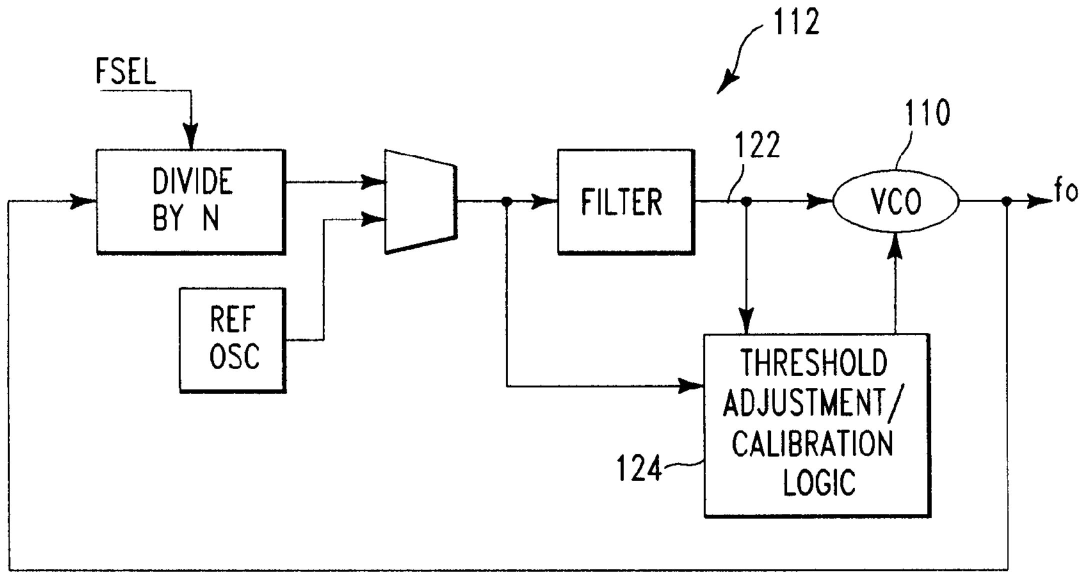
FIG. 7 is a block and schematic diagram of a phase locked loop incorporating a VCO according to an embodiment of the invention.

In order to implement the VCO calibration method described herein with respect to FIG. 6, it is necessary to provide a way of varying the lower and upper threshold levels Vt and +Vt, and a way of determining how the control voltage value compares to the variable lower and upper threshold levels. FIG. 7 illustrates a phase locked loop arrangement (PLL) 112 including a VCO 110 and threshold adjustment and calibration logic 124 according to an embodiment of the invention. PLL 112 differs from the prior art PLL 12 in the content and function of the calibration circuitry 124. The calibration circuitry 124 has a function of comparing the VCO control voltage 122 to a lower threshold −Vt and an upper threshold +Vt to determine if the control voltage has reached a suitable value at which the VCO can remain locked. The calibration circuitry 124 also has a function of widening the range between the lower and upper thresholds when needed for the VCO control voltage 122 to fall between the lower and upper thresholds.

Figure 8:
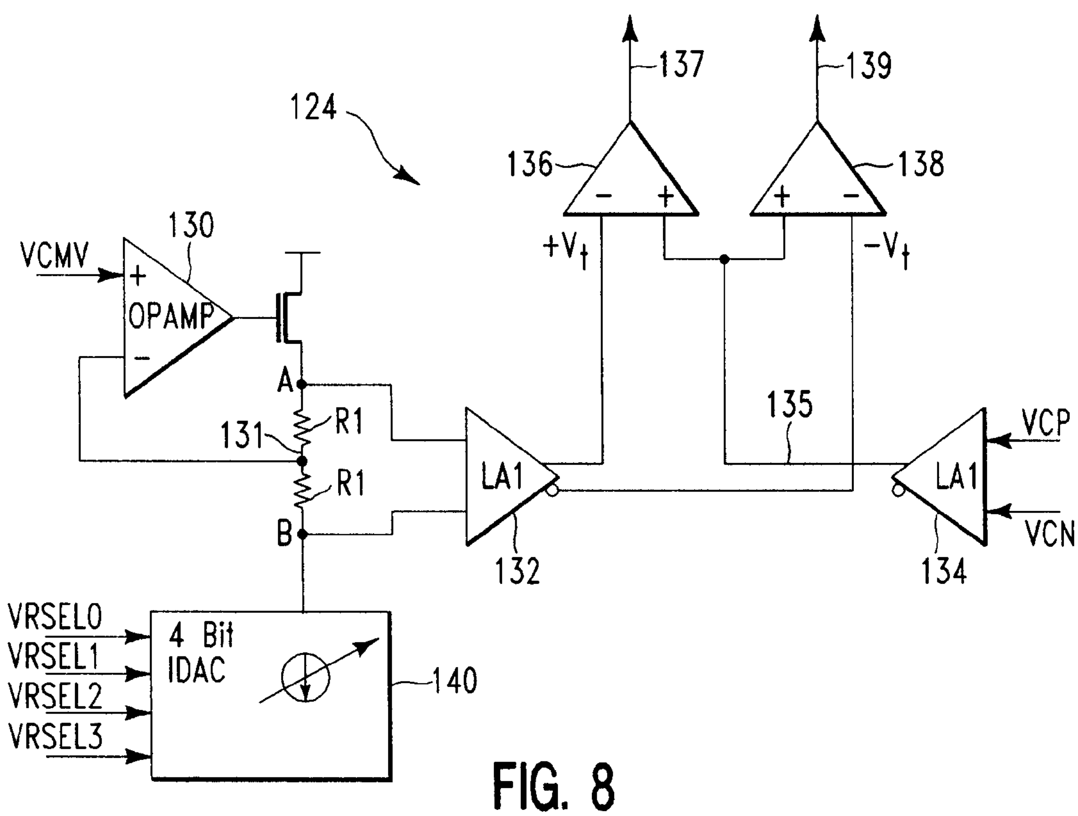
FIG. 8 is a schematic diagram illustrating a threshold adjustment and calibration circuit utilized in a VCO according to an embodiment of the invention illustrated in FIG. 7.

A schematic diagram illustrating threshold adjustment/calibration circuitry 124 according to an embodiment of the invention is illustrated in FIG. 8. As shown in FIG. 8, the circuitry 124 includes an operational amplifier 130, a first linear amplifier 132, a second linear amplifier 134, two voltage comparators 136 and 138 and a digital to analog converter 140 providing a converted analog current output (IDAC) rather than a voltage output. The VCO 110 operates with respect to a control voltage 122 provided thereto as differential signals on a pair of conductors. The calibration circuitry 124 is arranged to receive the VCO control voltage as a pair of differential signals VCP and VCN input at linear amplifier 134, and is further arranged to receive a common mode VCO control voltage VCMV representing the average of the two differential signals VCP and VCN at the input to operational amplifier 130.

The operational amplifier 130 functions to maintain the node 131 at a constant common mode voltage level VCMV. Voltage VCMV represents the center or zero volt position of a range of voltages over which the control voltage 122 swings. The node 131 is maintained at the voltage VCMV, and the voltages at node A and node B are referenced to that voltage VCMV, such that VCMV lies halfway between the voltage at node B and that at node A. The outputs of the linear amplifier 132 are the upper threshold +Vt and the lower threshold Vt, generated from the voltages at node A and at node B, respectively.

The actual separation in volts between the voltages at node B and at node A is determined by a combination of the resistances R1 between node 131 and each of the nodes A and B, and by the amount of current which is drawn by the IDAC 140 through the resistances R1. Stated another way, the separation between the voltages at node B and at node A is controlled by varying the current flow of the IDAC 140. The amount of current drawn by the IDAC 140 through the resistors R1 is controlled by the four bits VRSEL0–VRSEL3 that are input to the IDAC 140. The four-bit control enables the current output of the IDAC 140 to have as many as sixteen different values, thus allowing the voltage threshold levels +Vt and Vt to have as many as sixteen different values.

Figure 9:
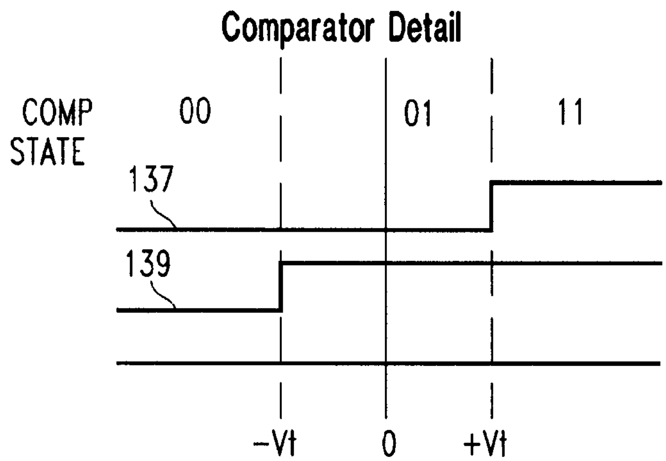
FIGS. 9 and 10 further illustrate VCO calibration operations according to embodiments of the invention.

Comparators 136 and 138 determine whether or not the VCO control voltage 122 falls within the range of voltages Vt to +Vt. The linear amplifier 134 operates to convert the VCO control voltage signal 122, received as a pair of differential signals VCP and VCN, to a single-ended signal 135 representative of the VCO control voltage. That single-ended signal 135 is provided to the positive inputs of the two comparators 136 and 138. Comparator 136 then compares the single-ended signal 134 representing the VCO control voltage to the upper threshold (+Vt). As illustrated in FIG. 9, the output 137 of comparator 136 is a step function which transitions from low ("0") to high ("1") when the single-ended signal 135 exceeds the upper threshold +Vt.

Comparator 138 compares the single-ended signal 135 representing the VCO control voltage to the lower threshold (−Vt). The output 139 of comparator 138 is also a step function (FIG. 9) which transitions from low ("0") to high ("1") when the single-ended signal 135 exceeds the lower threshold In such manner, the two comparators 136 and 138 provide outputs 137 and 139 representing whether the VCO control voltage exceeds the lower threshold Vt and whether the VCO control voltage exceeds the upper threshold +Vt, respectively. As best shown in FIG. 9, the outputs 137 and 139 together represent whether the VCO control voltage 122 falls below the range Vt to +Vt (output state "00"), within the range Vt to +Vt (output state "01"), or exceeds the range (output state "11").

Figure 10:
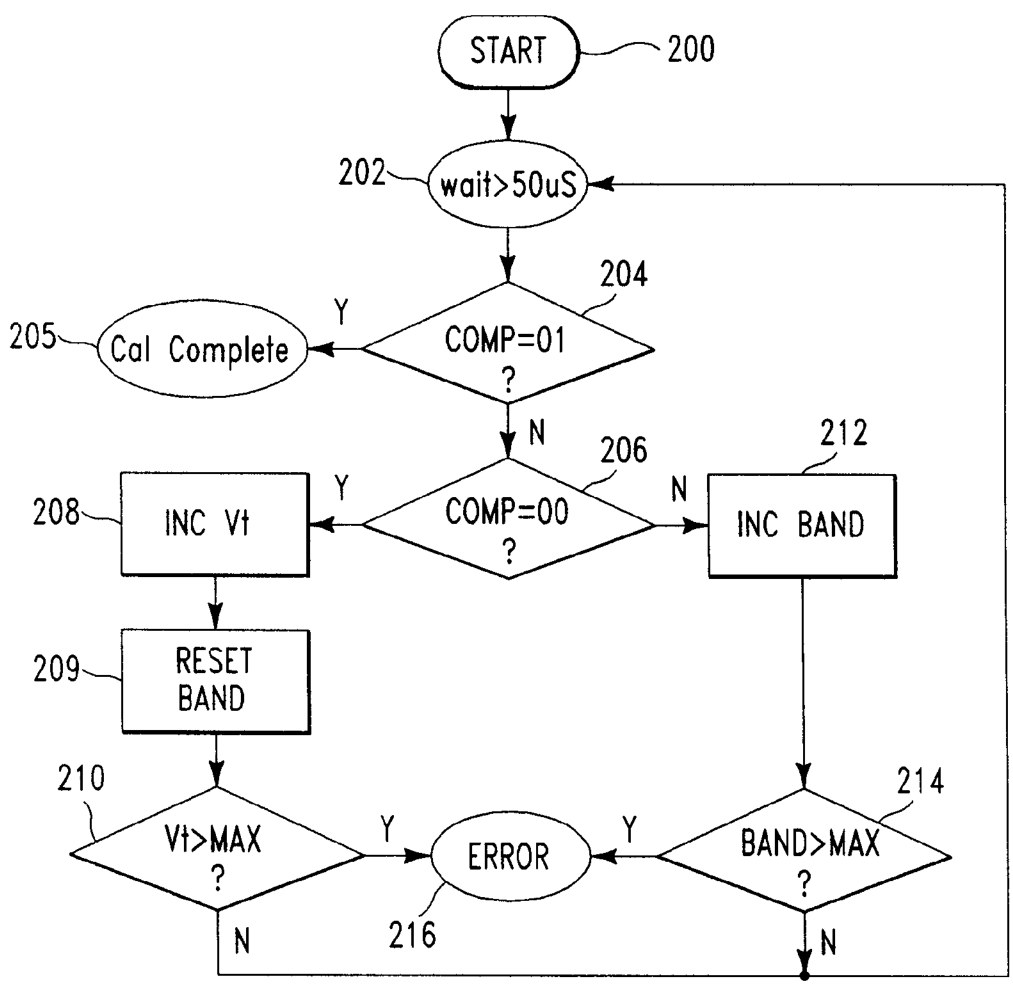

FIG. 10 is a flowchart illustrating a method of calibrating the VCO 110 according to an embodiment of the invention. As illustrated with respect to FIG. 10, the method begins by setting the VCO to establish a desired output frequency $f_o$, and then waiting for a sufficient period of time, e.g. 50 μsec, for the VCO to reach a frequency band and control voltage setting at which the desired output frequency is achieved. As described above with respect to FIG. 6, operation begins from a lowest frequency band setting and lowest control voltage value. After the waiting interval, the outputs 137 and 139 are tested in block 204 to determine whether the VCO control voltage falls within or outside of the range Vt to +Vt within which it is desirable to lock the VCO. If the comparator outputs 137 and 139 are "01", respectively, this indicates that the VCO control voltage 122 does fall within the range Vt to +Vt. Accordingly, under such condition, the calibration is determined to be complete, and the calibration procedure is ended at block 205.

However, if the outputs 137 and 139 are not "01", respectively, then a further comparison is made at block 206 to determine whether the outputs 137, 139 are "00". If the outputs do show "00" respectively, the VCO control voltage falls below the lower voltage threshold Vt. In response, the magnitude of the threshold level Vt is incrementally increased, as indicated at block 208. Referring again to FIG. 8, the threshold levels are incrementally widened by changing the values of the bits VRSEL0–VRSEL3 input to the IDAC 140. With the four-bit control thus provided, the threshold levels are changed between to one of sixteen possible levels. At this time, the frequency band is reset again to the lowest setting (block 209) such that the search for appropriate settings to lock the VCO is begun again from a lowest frequency band and control voltage setting.

Provided that Vt does not now exceed its maximum value (block 210), the calibration circuitry 124 waits again, at block 202, a 50 μsec interval of time for the VCO to reach a frequency band and control voltage setting which results in the desired output frequency $f_o$. Then, at block 204, the outputs 137, 139 are tested to determine if they show a state of "01". If they do, the VCO is determined to be locked at an appropriate condition, and the procedure therefore stops at block 206, the calibration being determined to have completed. However, if the outputs 137, 139 do not show a state of "01", then the outputs are tested, at block 206, to determine whether they show a state of "00". This time, it is assumed that the outputs 137, 139 do not show a state of "00", but in fact show the state of "11", respectively.

Such output state indicates that the VCO control voltage 122 lies above the upper threshold +Vt which delimits the allowed lock range for the VCO. Under such condition, the calibration circuit 124 responds by incrementing the frequency band, as indicated at 212. Then, so long as the value of the frequency band does not exceed the maximum value, at block 214, an attempt is made again to find appropriate VCO settings using that frequency band selection. The calibration procedure begins again from step 202 in which the circuitry 124 waits 50 μsec for a control voltage setting to be reached at which the VCO is locked.

FIG. 10 also illustrates a result when Vt is increased to a point exceeding its allowed maximum value. Testing is performed at block 210 to determine whether such is the case, and if so, an error is declared at block 216. An error handling routine is then performed, which results in resetting the threshold voltage Vt to a low setting or midrange setting, resetting the frequency band to a lowest band, and beginning the calibration procedure again, from the step of waiting 50 μsec for the control voltage to stabilize.

FIG. 10 also illustrates a condition in which the frequency band is incremented to a point which exceeds its maximum value. Testing is performed at block 214 to determine whether such is the case. If so, an error is declared at block 216. Again, an error handling routine is then performed, which results in resetting the frequency band, and resetting the threshold voltage Vt to a low setting or mid-range setting. The calibration procedure is then begun again, beginning from the step of waiting 50 μsec for a control voltage to be reached at which the desired output frequency $f_o$ is attained.

Such calibration procedure continues as shown in the flowchart illustrated in FIG. 10 until a frequency band setting and a control voltage setting are reached at which the desired output frequency $f_o$ is attained. These are accomplished while incrementing the range of threshold voltages Vt to +Vt to a size just large enough to accommodate a unique combination of a control voltage setting and frequency band setting which are desirably close to the midpoint of the control voltage range, i.e. zero volts.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A voltage controlled oscillator (VCO), comprising:

a threshold level setting circuit operable to set a lower threshold level and an upper threshold level, said lower and upper threshold levels being variable;

a frequency band selection unit operable to adjust a frequency band setting of said VCO to one of a plurality of frequency band settings;

a comparator circuit operable to determine whether a control voltage of said VCO falls between said lower threshold level and said upper threshold level; and a calibration circuit operable to cause said frequency band selection unit to maintain said frequency band setting when said control voltage falls between said lower threshold level and said upper threshold level and, otherwise, when said control voltage lies below said lower threshold level, to cause said threshold level setting circuit to adjust said lower threshold level downward and adjust said upper threshold level upward.

2. The VCO of claim 1 wherein said calibration circuit is further operable to cause said frequency band selection unit to adjust said frequency band setting to a lowest frequency band when said control voltage lies below said lower threshold level.

3. The VCO of claim 2 wherein said calibration circuit is further responsive to at least one of said lower threshold level and said upper threshold level surpassing a predetermined value to cause said frequency band selection unit to adjust said frequency band to the lowest frequency band setting and to cause said threshold level setting circuit to restore said lower and said upper threshold levels to initial values.

4. The VCO of claim 3 wherein said calibration circuit is further responsive to said frequency band setting exceeding a predetermined maximum value to cause said frequency band selection unit to adjust said frequency band to the lowest frequency band setting.

5. The VCO of claim 1 wherein said calibration circuit is further operable to cause said frequency band selection unit to adjust said frequency band setting upward until said control voltage falls between said lower threshold level and said upper threshold level, or until said control voltage falls below said lower threshold level after passage of a predetermined time interval.

6. The VCO of claim 1 wherein said control voltage is represented as a pair of differential signals.

7. The VCO of claim 6 wherein said comparator circuit comprises a first comparator operable to determine whether said control voltage represented by said pair of differential signals exceeds said upper threshold level, and a second comparator operable to determine whether said control voltage represented by said pair of differential signals falls below said lower threshold level.

8. The VCO of claim 7 wherein said threshold level setting circuit includes a current mode digital analog converter (IDAC).

9. The VCO of claim 8 wherein said IDAC adjusts said lower threshold level downward and said upper threshold level upward by supplying current in measured quantities to generate resistive voltage drops across two like-valued resistances, said resistances sharing a common node held at a voltage at the center of a range over which said control voltage swings.

10. The VCO of claim 9 wherein said measured current quantities output by said IDAC are controlled by a plurality of selection bits.

11. A method of calibrating a voltage controlled oscillator (VCO) of a phase locked loop (PLL) when resetting an output frequency of said VCO, comprising:

a) setting a lower threshold level and an upper threshold level;

b) changing a control input to the PLL and waiting for VCO settings to stabilize;

c) maintaining a frequency band selection of said VCO when a control voltage of said VCO lies between said lower threshold level and said upper threshold level, otherwise, when said control voltage lies below said lower threshold level, adjusting said lower threshold level downward, adjusting said upper threshold level upward and when said control voltage lies above said upper threshold level, selecting a higher frequency band; and d) repeating said step c) so long as said control voltage does not lie between said lower threshold level and said upper threshold level.

12. The method of claim 11 further comprising adjusting said frequency band setting to a lowest frequency band when said control voltage lies below said lower threshold level.

13. The method of claim 12 further comprising adjusting said frequency band to the lowest frequency band setting and restoring said lower threshold level and said upper threshold level to initial values when at least one of said lower threshold level and said upper threshold level goes beyond a predetermined value.

14. The method of claim 13 further comprising adjusting said frequency band to the lowest frequency band setting when said frequency band setting exceeds a predetermined maximum value.

15. The method of claim 11 further comprising adjusting said frequency band setting upward until said control voltage falls between said lower threshold level and said upper threshold level, or until said control voltage falls below said lower threshold level after passage of a predetermined time interval.

16. The method of claim 11 wherein said control voltage is represented as a pair of differential signals.

17. The method of claim 16 wherein said step c) includes comparing said control voltage to said lower threshold level by way of a first comparator, and comparing said control voltage to said upper threshold level by way of a second comparator.

18. The method of claim 17 wherein said lower threshold level and said upper threshold level are adjusted in magnitude by varying the output of a current mode digital analog converter (IDAC).

19. The method of claim 18 wherein said lower threshold level is adjusted downward and said upper threshold level is adjusted upward by said IDAC supplying current in measured quantities to generate resistive voltage drops across two like-valued resistances, said resistances sharing a common node held at a voltage at the center of a range over which said control voltage swings.

20. The method of claim 19 wherein said measured current quantities output by said IDAC are controlled by a plurality of selection bits.

* * * * *